United States Patent [19]

Mahvan et al.

[11] Patent Number: 5,614,071
[45] Date of Patent: Mar. 25, 1997

[54] SPUTTERING SHIELD

[75] Inventors: Nader Mahvan, Cupertino; David Wilkinson, Danville, both of Calif.; Koji Ichikawa, Kumagaya, Japan

[73] Assignee: HMT Technology Corporation, Fremont, Calif.

[21] Appl. No.: 495,983

[22] Filed: Jun. 28, 1995

[51] Int. Cl.6 .................................................. C23C 14/34
[52] U.S. Cl. ........................ 204/298.11; 204/192.12
[58] Field of Search ...................... 204/298.01, 298.02, 204/298.11, 298.18, 192.12

[56] References Cited

U.S. PATENT DOCUMENTS

| | | | |
|---|---|---|---|
| 5,080,774 | 1/1992 | Heitzer | 204/298.11 |
| 5,135,629 | 8/1992 | Sawada et al. | 204/192.12 |
| 5,135,634 | 8/1992 | Clarke | 204/298.06 |
| 5,228,963 | 7/1993 | Rose | 204/192.12 |
| 5,240,580 | 8/1993 | Henderson et al. | 204/192.12 |

*Primary Examiner*—R. Bruce Breneman
*Assistant Examiner*—Rodney G. McDonald
*Attorney, Agent, or Firm*—Peter J. Dehlinger; Judy M. Mohr

[57] ABSTRACT

A shield for use in a sputtering system. The shield includes a support having an inner expanse defining a two-dimensional array of cavities. The cavities are formed of two-dimensionally concave wall surfaces, where the intersections of the wall surfaces of adjacent cavities form a two-dimensional array of edges on the expanse. The shield minimizes the tendency of material deposited on the shield surface, such as sputtered carbon material, from flaking off during a sputtering operation. Also disclosed is a sputtering assembly that employs the shield.

8 Claims, 4 Drawing Sheets

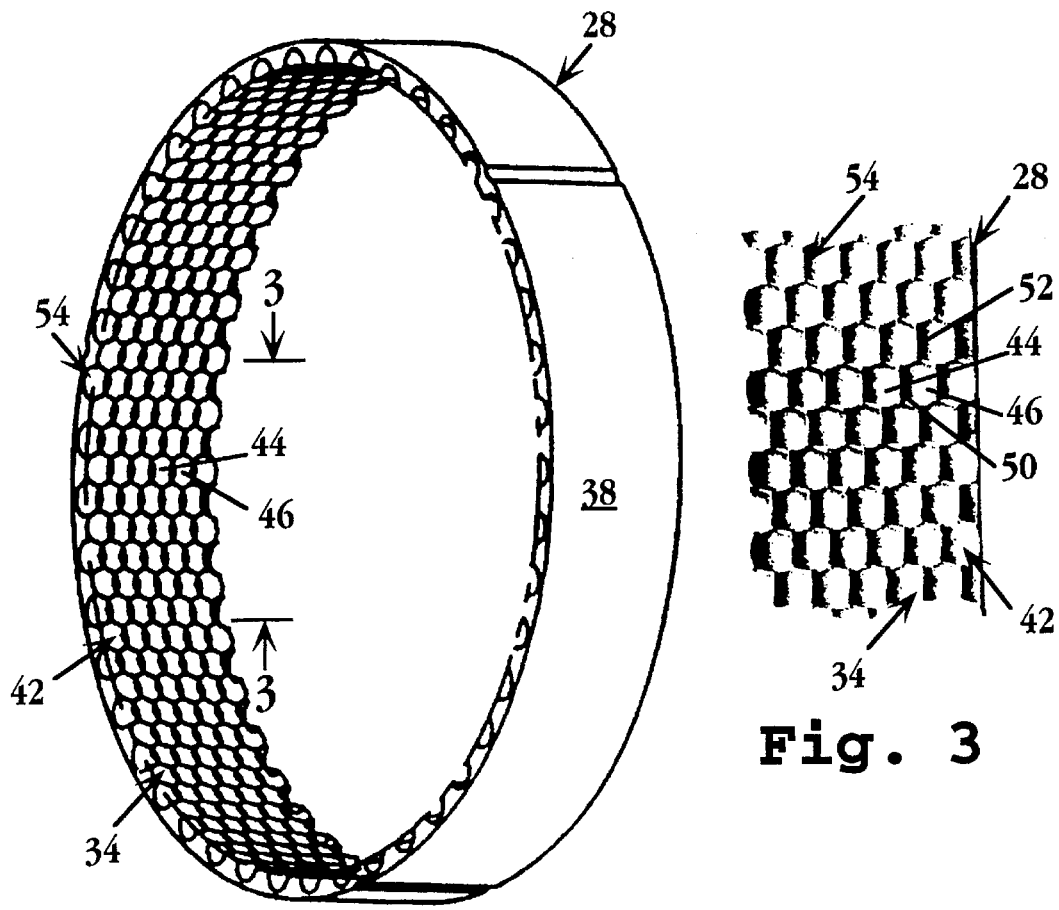
Fig. 2
Fig. 3
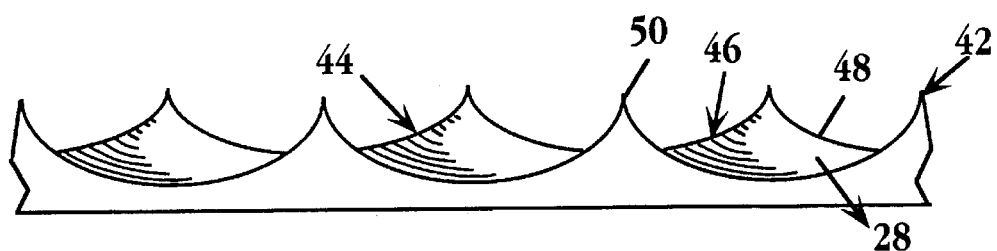
Fig. 4A
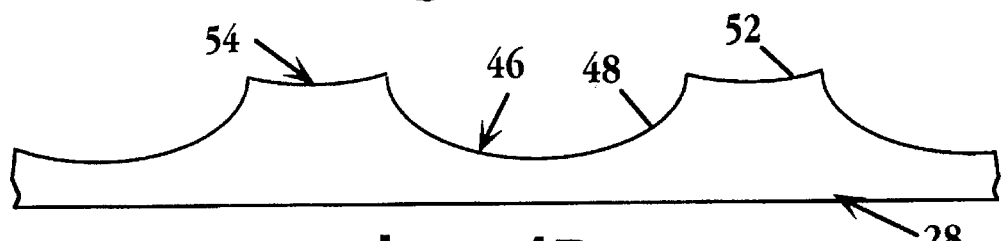
Fig. 4B

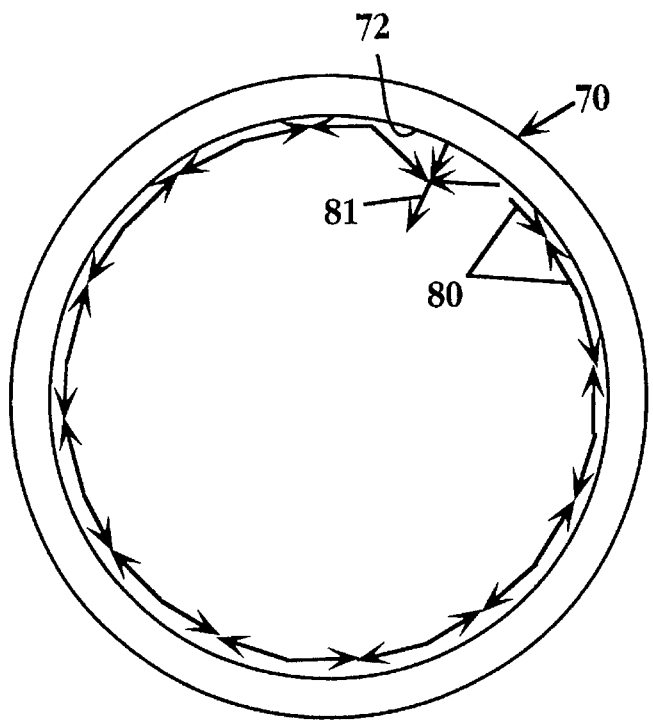
Fig. 7
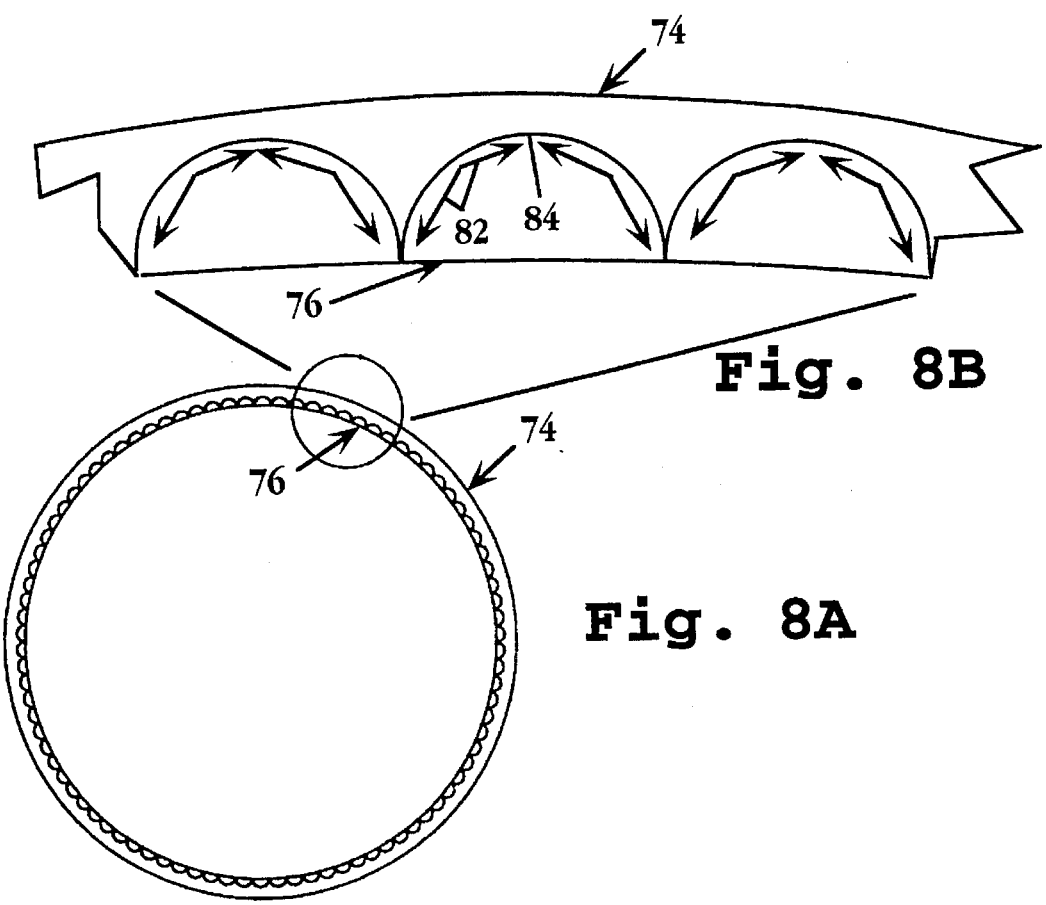
Fig. 8B
Fig. 8A

SPUTTERING SHIELD

FIELD OF THE INVENTION

The present invention relates to shields for use in a sputtering system.

BACKGROUND OF THE INVENTION

Sputter deposition is commonly used for forming thin-layer films or well-defined thickness and crystal orientation on a substrate. For example, thin-film magnetic recording media or discs are manufactured by sputtering a series of layers, such as an underlayer, a magnetic recording layer and a protective overlayer, on a substrate disc.

In a sputtering operation, a gas—typically argon—is introduced into the sputtering chamber to serve as a medium in which gas discharge is initiated and sustained. By placing a negative bias on the target, positive ions in the discharge are drawn to the cathodic plate, where they eject neutral atoms through momentum transfer. These atoms pass through the discharge region to be deposited on a substrate. Additional particles, including negative ions, are also discharged from the target, and may be accelerated toward the substrate, to bombard the film being deposited. The sputtering plasma can be focused, to achieve greater plasma density and stability, by applying a magnetic field across the target. This approach, known as magnetron sputtering, is useful in achieving high sputtering rates.

In a typical sputtering assembly, the substrate is placed near the target, with the target surface confronting the substrate surface. The region between the target and substrate is shielded, e.g., by an annular ring extending between the two, to capture wide-angle deposition material that is not directed against the target and which would otherwise be ejected into the sputtering chamber. Shields of this type typically have smooth inner surfaces on which the wide-angle material is deposited.

Because of relatively rapid accumulation of material on the shield's inner surface, shields of this type must be removed from the sputtering apparatus and cleaned frequently, e.g., by sand-blasting. A more serious problem can arise in the case of deposited carbonaceous material, such as the carbon deposits that form when a carbon overcoat is sputtered onto a magnetic thin-film medium. The carbon deposits can easily flake off during a sputtering operation. When flaked-off deposits fall into the sputtering plasma, the deposits can explode, meteor-like, throwing off particles in all directions that can result in damage to the deposition surface. This can be observed as plasma arcing during the sputtering operation.

It would therefore be desirable to provide a sputtering shield, particularly for use in carbon deposition, that effectively prevents such arcing, and increases the amount of material that can safely accumulate on the shield surface during a sputtering operation.

SUMMARY OF THE INVENTION

The invention includes, in one aspect, a shield for placement between a sputtering target and a substrate in a sputtering system, for capturing sputtered material, e.g., carbon, not deposited on the substrate. The shield is formed of a support having an inner expanse adapted to capture sputtered material. This expanse defines a two-dimensional array of cavities, each formed of two-dimensionally concave wall surfaces, where the intersections of the wall surfaces of adjacent cavities form a two-dimensional array of edges on the expanse.

The inner expanse may be formed on an annular, planar or offset-plane surface.

In a preferred embodiment, the wall expanse of the support defines a honeycomb array of cavities, with cavity depths that increase the surface area of the expanse at least about 75% over a smooth-surfaced expanse having the same dimensions.

Also disclosed is a sputter-gun assembly that includes the shield. The assembly has a sputter gun for holding a target, such as a carbon target, at a position confronting the target, and the above shield disposed between the substrate and holder.

These and other objects and features of the invention will be more fully appreciated when the following detailed description of the invention is read in conjunction with the accompanying drawings.

BRIEF DESCRIPTION OF THE DRAWINGS

FIG. 2 is a perspective view of a sleeve shield member showing an inner shield expanse constructed in accordance with the invention;

FIG. 3 is a front-on view of an inner expanse region 3—3 of the shield shown in FIG. 2;

FIGS. 4A and 4B are enlarged sectional views taken along horizonal and vertical view lines, respectively, in FIG. 3;

FIG. 7 illustrates the compressive stresses on carbon deposited on a smooth annular shield surface; and FIGS. 8A and 8B illustrate the compressive stresses on carbon deposited on a shield having a honeycomb surface constructed in accordance with the invention.

DETAILED DESCRIPTION OF THE INVENTION

Figure 1:
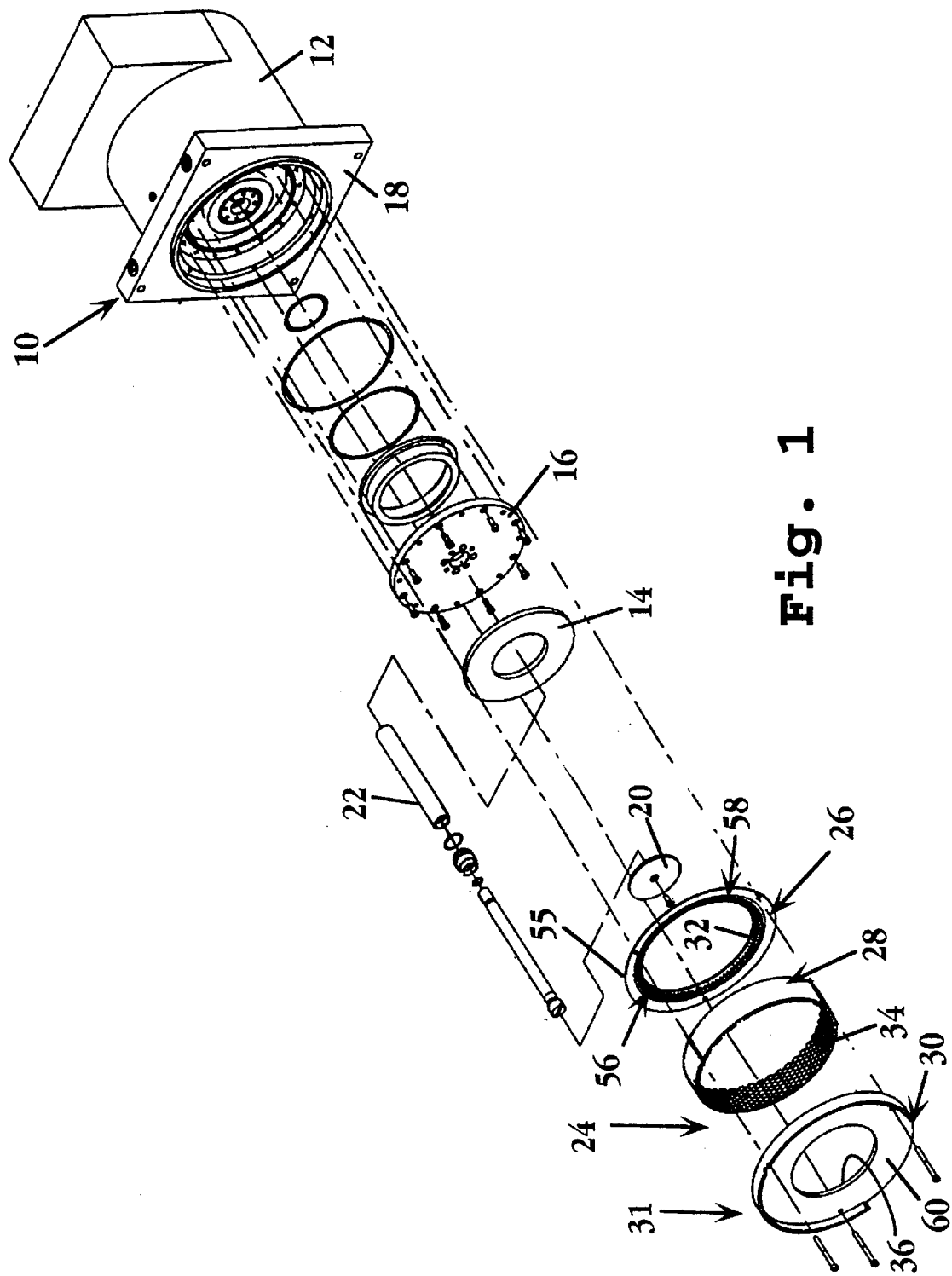
FIG. 1 is an exploded view of a sputter gun assembly employing a shield constructed in accordance with the invention.

FIG. 1 shows a sputter gun apparatus 10 constructed in accordance with the present invention. The apparatus includes a sputter gun 12 adapted to hold a target 14, such as a carbon target, at a position adjacent a substrate (not shown). The target is mounted on a target plate 16 which forms part of the sputter gun and which is attached to a target-gun base 18, as indicated. The sputter gun includes suitable voltage and magnetic field voltage means for igniting and sustaining a target-material plasma in a suitable atmosphere, e.g., a low- vacuum Ar atmosphere. The target is electrically connected to the voltage means by an electrode cap 20 which is connected to the sputter gun by a conductive pin 22. These components of the sputter-gun assembly are conventional, and are commercially available, e.g., from Intevac (Santa Clara, Calif.).

Also included in the apparatus is a shield assembly 24 composed of three shields or shield members 26, 28, 30, constructed in accordance with the invention. As can be appreciated from the drawing, the three shield members, when assembled, form a cylindrical shield housing 31 having an inner opening 32 defined by the opening in shield member 26, a cylindrical wall expanse 34 formed by shield member 28, and an outer opening 36 defined by the opening in shield member 30.

In the assembled sputtering apparatus, the target is placed immediately adjacent opening 32 in the shield housing, such that material sputtered from the target is either directed through opening 36 in the shield housing onto the substrate or captured on the inner expanses of the housing.

Shield member 28 is shown in enlarged view in FIG. 2. The member is formed of a metal ring support 38 having inner wall or expanse 34 which forms the axially extending wall portion of shield housing 31. A portion of the expanse between figure lines 3—3 in FIG. 2, is shown in planar view in FIG. 3. According to an important feature of the invention, and as seen best in FIG. 3, the inner expanse defines a two-dimensional honeycomb array 42 of cavities, such as cavities 44, 46.

FIG. 4A shows a cross-section of a portion of the array taken along a horizontal section line through a center region of cavities 44, 46, and an adjacent cavity. As seen, each cavity is formed of a concave wall surface, such as surface 48 in cavity 46, defining a circular arc in cross-section. The wall surfaces in adjacent cavities meet at sharp edges, such as edge 50 formed at the intersection of cavities 44, 46.

FIG. 4B shows a vertical cross-section of a portion of the array taken along a vertical section line in FIG. 3 corresponding to an edge 52 formed between the two cavities immediately above cavity 46 in FIG. 3. The wall surface indicated at 48 in the figure corresponds to wall surface 48 in FIG. 4A, but viewed in a direction normal thereto in the x-y plane of the array. As seen, the wall surfaces in this direction also define circular arcs in cross-section. As can be appreciated from FIGS. 3 and 4B, the edges seen in FIG. 4B, such as edge 52, are formed at the intersection of the wall surfaces in two immediately adjacent cavities.

The cavities are thus seen to be formed of two-dimensionally concave wall surfaces (concave in both the x-y directions of the array), where the intersections of the wall surfaces of adjacent cavities form a two-dimensional array 54 (FIG. 3) of edges on the expanse. That is, the entire surface is formed of concave, preferably hemispherical surface regions partitioned by sharp edges. This configuration provides three important advantages in a sputter-capture surface. First, the surface area of the expanse is increased significantly, preferably at least about 50% with respect to smooth-surfaced expanse. Secondly, the capture surfaces in the expanse are concave, preferably small-radius hemispherical, surfaces. Finally, the expanse is substantially devoid of flat surfaces, there being only concave and sharp-edge surfaces. These advantages are discussed further below.

Shields 26 and 30 also forming the shield housing (FIG. 1) have a construction similar to that of shield 28 just described. In particular, shield 26 includes a support 55 having an annular inner expanse 56 adjacent opening 32 and facing the side of the shield seen in the figure. The inner expanse defines a two-dimensional annular array 58 of cavities, like those described with reference to shield 28. That is, the cavities are formed of two-dimensionally concave wall surfaces whose intersections form a two-dimensional, annular array of edges on the inner expanse. In this expanse, the array consists of three concentric rows of cavities, where the rows are offset from one another in an axial direction, with the inner two rows being composed of four-wall cavities, and the outer row being composed of shell-shaped cavities.

Shield 30 likewise includes a support 60 having an inner expanse on the side of the shield not seen in the figure, and arrayed about opening 36 in the shield. The expanse defines an annular honeycomb array of cavities like the one shown in FIG. 3. The expanse in this shield serves to capture sputtered material, such as carbon, deposited in the region between the outer periphery of the shield expanse and opening 36.

Figure 5A:
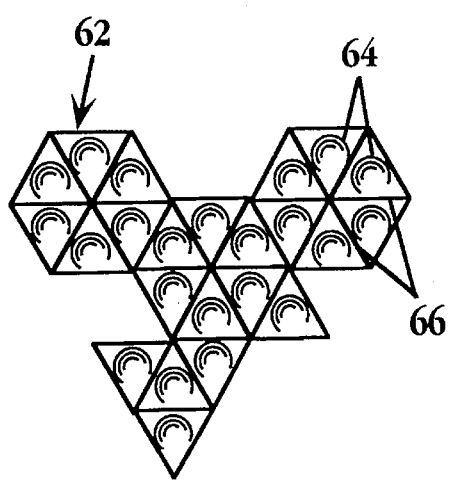
FIGS. 5A and 5B illustrate alternative surface array embodiments of the invention.
Figure 5B:
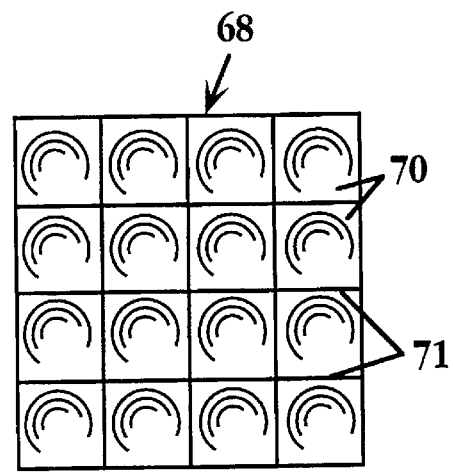

The above shields may be formed from aluminum, copper, or the like, by conventional casting or metal stamping methods. The cavity arrays have preferred cavity dimensions of about 3/inch–7/inch, preferably about 5/inch in both the vertical and horizontal directions in FIG. 3, or in both radial and angular directions for the annular array. The array pattern is preferably a honeycomb pattern of cavities, as shown in FIGS. 2 and 3, in the case of a planar cylindrical array (FIG. 2), although other cavity patterns, such as the one described with reference to shield 28, are suitable. By way of example, FIG. 5A shows a portion of an array 62 formed of cavities, such as cavities 64, whose concave wall surfaces intersect to form a triangular pattern of triangular edges, such as edges 66. FIG. 5B shows an array 68 of cavities, such as cavities 70, whose concave wall surfaces intersect to form a rectangular pattern of edges such as edges 71.

In operation, and with again reference to FIG. 1, a substrate (not shown) is placed in the line of "sight" of the shield housing, i.e., with the substrate surface immediately adjacent and facing opening 36 in the housing. The assembly and substrate are contained in a sputtering chamber that is evacuated and filled to low pressure with a suitable sputtering gas, such as argon, or a mixture or argon and methane and/or nitrogen. The sputter gun is operated conventionally to sputter material from a carbon or other target. An electrical potential between the target and substrate serves to direct plasma from the target onto the substrate.

Figure 6:
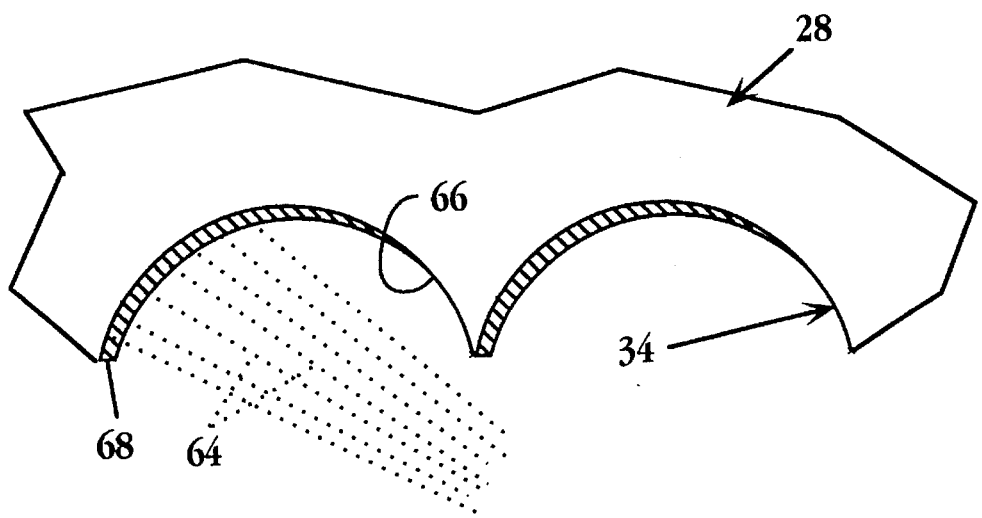
FIG. 6 is an enlarged cross-section view of a cavity in a shield of the invention, illustrating the buildup of carbon deposits within the cavity during sputtering.

As the sputtered material is directed from the target onto the substrate surface, a portion of the material (having wide sputtering angles) is deposited on the inner expanses of the shields, and particularly, on the expanses in shields 28, 30. The accumulation of deposited material on the cylindrical expanse 34 in shield 28 during a sputtering operation is seen in FIG. 6. Here the trajectories of sputtered material captured within a cavity 66 in the expanse are indicated by right-to-left trajectory lines 64. As can be appreciated, there is progressively more shadowing of the trajectories in a left-to-right direction in the figure, leading to progressively thicker material deposition 68 in this direction, as indicated. Further, since the material that strikes the downstream side of the cavity (left side in FIG. 6) are along trajectories more normal to the cavity surface, and therefore strike the cavity surface with greater momentum, the deposited material will tend to be more densely packed than in the downstream side of the cavity.

FIGS. 7, 8A and 8B illustrate the difference in stresses experienced by material deposited on a shield 70 having a conventional planar expanse 72 (FIG. 7) and on a shield 74 having a honeycomb surface expanse 76 formed in accordance with the invention (FIG. 8A), and seen in enlarged sectional view in FIG. 8B.

FIG. 7 shows radial and tangential forces acting on a layer of material (not shown), such as carbon, deposited on the smooth annular expanse of shield 70. Tangential compressive forces within the plane of the layer, such as indicated by arrows 80 in the figures, arise from global thermal expansion or contraction as the sputtering shield is heated then cooled during a sputtering operation, from differential thermal expansion/contraction between the deposited material and underlaying metal expanse, and from localized stresses due to uneven heating or deposition layer thickness. As can be appreciated from the figures, compressive stresses within the layer lead to localized instabilities that are most easily relieved by radial forces, such as indicated by arrow 81, acting normal to and away from the shield surface. This leads to buckling in the deposition layer, causing fragments to be broken away from shield surface.

FIG. 8B illustrates how the problem of layer fragmentation is solved by the present invention. As seen particularly in FIG. 8B, compressive forces within a deposited layer, indicated by arrows 82 in cavity 84 in the shield, act to press the layer against the cavity walls, i.e., in the direction that serves to compress the layer against the cavity wall surface. Further, since the deposition "layer" is effectively partitioned into a number of small, discrete regions, the compressive forces acting on the layer formed within any cavity are relatively small.

The surface requirements, then, for optimal retention of deposited material are (i) relatively small cavities, e.g., on the order of 3–7/inch as noted above, and (ii) relatively pronounced wall curvature in the cavities, e.g., a curvature close to that of ⅓ to ½ of a sphere.

Periodically, the sputtering shields forming the shield housing must be cleaned of deposits, and this can be done conventionally by sand-blasting or the like. Because of the greater surface area of the shields' expanses, and because thicker surface deposits can accumulate without significant risk of deposit flaking during sputtering, the shields will function satisfactorily over longer sputtering periods than conventional shields.

One measure of adequate functioning is the time the shield can function without appreciable flaking, which is evidenced by arcing in a sputtering apparatus shield and consequent development of asperities on a disk surface. In one study conducted at a selected sputtering voltage, it was found that the shield of the invention can be used for a total sputtering period of over 30 hours without flaking, as compared with 15 hours for a conventional shield.

In another study, the level of asperities appearing on a sputtered disc surface was measured as a function of total sputtering time operation. The measure of asperities used was glide yield, which measures the frequency and amplitude of head collisions with a disc surface, when a piezoelectric sensor bonded to a head flies over the disc surface. Here it was found that an above-threshold level of asperities were observed on discs after 10 KWH of sputtering operation using a conventional sputtering shield; the same level of asperities were produced after 20 KWH of operation with the shield of the present invention. Thus, the shield increases normal operation time (between cleaning) at least about twofold, giving a significant advantage in terms of total throughput and material utilization.

From the foregoing, it can be appreciated how various objects and features of the invention are met. The greater surface area of the shield expanse leads to slower buildup of material on the shield surface. At the same time, the impact angle of sputtered material on the shield is greatest in the regions of thickest layer buildup, reducing the possibility that thickness-dependent stresses will fragment the deposited layer. Stresses within the deposited layer are reduced because of the relatively small cavity area in which stresses can accumulate. Finally, the concave surfaces forming the shield expanse surfaces act to distribute forces within the deposition layer inwardly, against the walls of the cavities, serving to compact rather than fragment the layer.

The importance of this last feature is illustrated by the studies comparing the performance of the present invention with a shield surface having a surface pattern of convexities, i.e., a pattern which is the surface complement of the present invention. The latter shield shows even greater tendency to shed carbon deposits than a smooth-walled surface, presumably because internal stresses formed within the deposit layer are accommodated by movement of the layer away from the shield surface.

Although the invention has been described with respect to particular embodiments and features, it will be appreciated that various changes and modification may be made without departing from the invention.

It is claimed:

1. A sputtering apparatus shield for capturing sputtered material said shield comprising a support having an inner expanse adapted to capture such sputtered material, said expanse defining a two-dimensional array of cavities, each formed of two-dimensionally concave wall surfaces, where the intersections of the wall surfaces of adjacent cavities form a two-dimensional array of edges on the expanse.

2. The shield of claim 1, wherein the support is an annular support defining an annular inner expanse.

3. The shield of claim 1, wherein the support defines one or more substantially planar expanses.

4. The shield of claim 1, wherein the wall expanse of the support defines a honeycomb array of such cavities.

5. The shield of claim 1, wherein said array increases the surface area of the expanse at least about 50% over a smooth-surfaced expanse having the same dimensions.

6. A sputter-gun assembly for use in sputtering a deposition material from a target, onto a substrate, comprising a sputter gun adapted to hold the target adjacent a plane occupied by the substrate, in operative conditions, and disposed between the target and such substrate plane, a shield for capturing sputtered material not deposited on the substrate, said shield including a support having an inner expanse adapted to capture such sputtered material, said expanse defining a two-dimensional array of cavities, each formed of two-dimensionally concave wall surfaces, where the intersections of the wall surfaces of adjacent cavities form a two-dimensional array of edges on the expanse.

7. The apparatus of claim 6, wherein the support is an annular support defining an annular inner expanse.

8. The apparatus of claim 7, wherein said array increases the surface area of the expanse at least about 75% over a smooth-surfaced expanse having the same dimensions.

* * * * *